United States Patent [19]

Kakinoki et al.

[11] Patent Number: 5,177,578
[45] Date of Patent: Jan. 5, 1993

[54] POLYCRYSTALLINE SILICON THIN FILM AND TRANSISTOR USING THE SAME

[75] Inventors: Hisashi Kakinoki; Tatsuro Nagahara; Keitaro Fukui, all of Ohi, Japan

[73] Assignee: Tonen Corporation, Tokyo, Japan

[21] Appl. No.: 574,865

[22] Filed: Aug. 30, 1990

[30] Foreign Application Priority Data

Aug. 31, 1989 [JP] Japan .................. 1-223260

[51] Int. Cl.⁵ .................. H01L 27/01; H01L 27/13; H01L 29/78
[52] U.S. Cl. .................. 257/64; 257/72
[58] Field of Search .......... 357/59 E, 59 R, 2, 23.7; 148/DIG. 122; 437/967; 430/84

[56] References Cited

U.S. PATENT DOCUMENTS

| 4,630,089 | 12/1986 | Sasaki et al. | 357/59 E |
| 4,719,501 | 1/1988 | Nakagawa et al. | 357/4 X |
| 4,742,020 | 5/1988 | Roy | 357/49 X |
| 4,768,076 | 8/1988 | Aoki et al. | 357/237 X |
| 4,963,506 | 10/1990 | Liaw et al. | 148/DIG. 122 |

FOREIGN PATENT DOCUMENTS

63-157872 6/1988 Japan .
63-175417 7/1988 Japan .

Primary Examiner—Andrew J. James
Assistant Examiner—Sara W. Crane
Attorney, Agent, or Firm—Nikaido, Marmelstein, Murray & Oram

[57] ABSTRACT

According to the present invention, a polycrystalline silicon thin film with a large crystal grain size is formed on a substrate, other than single crystalline silicon, e.g. on a glass substrate with a low strain point, by plasma CVD or photo CVD, and the polycrystalline silicon thin film thus obtained has a high (100) orientation percentage and a low (220) orientation percentage, a low hydrogen content, a low fluorine content in the film, and a large crystal grain size. It has excellent flatness and is suitable for microstructure fabrication and for the manufacture of a thin film transistor. Because a thin film transistor with a large area can be produced, it is also usable for many applications such as liquid crystal display. By introducing a high concentration of dopant into the interface region between the polycrystalline silicon film and the substrate, the growth of the polycrystalline grain is enhanced because the high concentration of dopant becomes the nucleus for crystal growth.

5 Claims, 2 Drawing Sheets

POLYCRYSTALLINE SILICON THIN FILM AND TRANSISTOR USING THE SAME

BACKGROUND OF THE INVENTION

The present invention relates to a polycrystalline silicon thin film to be used as a semiconductor, such as a thin film transistor or a solar cell, and in particular to a polycrystalline silicon thin film formed on a substrate other than a single crystalline silicon substrate, e.g. a transparent substrate such as a glass substrate, and also to a polycrystalline silicon thin film transistor using such a thin film.

Polycrystalline silicon thin film is an aggregation of a large number of silicon crystals of sizes of several hundreds of Å to several tens of μm. Compared with amorphous silicon, the mobility of electrons is higher by one to two orders of magnitude and has the excellent property that it can be formed on any substrate, except crystalline silicon, such as alumina or graphite, as has not been achievable with single crystalline silicon. A transistor using a polycrystalline silicon thin film has higher mobility than an amorphous silicon transistor and even peripheral driving circuits can be incorporated on the same substrate.

In general, such polycrystalline silicon thin film is formed by a thermal CVD method on a substrate at a high temperature of 600°–700° C. or more, and therefore the substrate must be resistant to such a high temperature. Also, because the substrate, on which the thin film and transistor are formed, can be lighted by backlight if it is transparent, it is suitable for use as a liquid crystal display, and there are strong demands to use transparent substrates, e.g. a glass substrate, as the substrate for polycrystalline silicon. However, the strain point of normal glass is 600° C. or lower, and it is impossible to form polycrystalline silicon on it. Therefore, when polycrystalline silicon thin film is formed on a glass substrate, heat-resistant glass, such as quartz glass, must be used. This is not suitable for mass production because it is very expensive.

Also, polycrystalline silicon thin film has a higher percentage of orientation (220) at low temperature, and the percentage of (220) orientation is decreased at higher temperature, while the percentage of (100) orientation tends to increase with the temperature. Because conventional type polycrystalline silicon thin film is formed by a thermal CVD method, the process temperature is high. As a result, the percentage of (220) orientation is low, and the percentage of (100) orientation is increased, whereas the usable substrate is limited because process temperature is high. In this respect, there has been a strong demand for a new thin film forming technique, which provides a lower percentage of (220) orientation and a higher percentage of (100) orientation in a low temperature process.

It is said that, when the percentage of (220) orientation is higher, transistor characteristics, particularly effective carrier mobility, is increased and the change over time during continuous operation is decreased. Thus, a proposal has been made to increase the percentage of (220) orientation. While this is on imperfect polycrystalline silicon with relatively smaller grain size, it is not certain whether it can be applied to polycrystalline silicon with larger grain size. On the contrary, when the percentage of (220) orientation is decreased. This results in a lack of surface flatness and a lower yield in microstructure fabrication.

Further, the results of a recent study reveal that, in the case of a polycrystalline silicon formed by the thermal CVD method, there are many voids between silicon grains because the temperature during manufacture is high, and that the dangling bonds at grain boundaries deteriorate electrical properties. To correct such inconveniences, it is necessary to passivate the grain boundary with hydrogen, and this is very disadvantageous.

Because glass substrates with a low strain point are relatively cheap, they are useful for the manufacture of thin film transistor. However, silicon thin film obtained on such a glass substrate is amorphous because of the restriction on the process temperature. Thus, a technique to form polycrystalline silicon thin film, with excellent electrical property, on glass substrate with a low strain point has not yet been established. When a polycrystalline silicon thin film is formed at relatively low temperature by a conventional technique, the silicon at the interface with the substrate is not crystallized (amorphous silicon) or crystals are found in finer state (microcrystalline silicon), and it is not possible to obtain polycrystalline silicon with large grain size.

In this respect, attention is focused now on a plasma CVD method to produce a polycrystalline silicon thin film at a low temperature (Japanese Provisional Patent Publications No. 63-157872 and No. 63-175417). In these methods, a large quantity of hydrogen gas is used as one of the components of reaction gas, and polycrystalline silicon thus obtained contains hydrogen between silicon grains compared with the product obtained by the thermal CVD method. Thus, it is not necessary to passivate polycrystalline silicon with hydrogen after the manufacture.

However, polycrystalline silicon thin film obtained by the above method contains hydrogen in a proportion of about 2.5 atoms % or more, and the grain size of the silicon is about 500 Å at the most.

SUMMARY OF THE INVENTION

It is an object of this invention to produce a polycrystalline silicon thin film with large grain size which has been formed at a relatively low temperature and also to provide a transistor formed from such thin film.

It is another object of the invention to produce a polycrystalline silicon thin film having high (100) orientation and lower (220) orientation and with high quality, and also to provide a thin film transistor formed from such thin film.

It is still another object of the invention to provide a polycrystalline silicon thin film of high quality formed on a transparent substrate, such as glass substrate, and also to provide a thin film transistor formed from such thin film.

It is still another object of the invention to provide a high-performance polycrystalline silicon thin film having large grain size and with a hydrogen content of 2.5 atom % or less, or more preferably, 1 atom % or less, and with a fluorine content of 3 atom % or less, or more preferably, 1 atom % or less, and also to provide a thin film transistor formed from such thin film.

Polycrystalline silicon thin film of this invention is characterized in that it is produced by a plasma CVD method or a photo CVD method on a substrate other than single crystalline silicon, using silicon hydride as the film forming gas, and silicon fluoride gas or silicon chloride gas as an etching gas. It has about 70% or more (100) orientation, both hydrogen content and fluorine content are at 1 atom % or less, and the grain size is 0.05–5 μm.

Also, the polycrystalline silicon thin film of this invention is characterized in that it is produced by a plasma CVD method or a photo CVD method at low temperature on a glass substrate having a strain point of 600° C. or lower and with almost no diffusion of impurities from the substrate. It has a (100) orientation of 70% or more, both hydrogen content and fluorine content of 1 atom % or less, and a grain size of 0.05–5 μm.

Polycrystalline silicon thin film of this invention is characterized in that it is a polycrystalline silicon thin film formed on a transparent substrate, that it contains a high concentration of dopant near the interface between the thin film and the substrate, that the concentration of said dopant is at least $10^x/cm^3$ or more at a location 100 Å from said interface, and that the grains size of the polycrystalline silicon in the upper portion of said thin film is at least 0.2 μm.

Polycrystalline silicon thin film transistor of this invention is characterized in that the polycrystalline silicon thin film is produced by a plasma CVD method or a photo CVD method on a transparent substrate, e.g. on a glass substrate with strain point of 600° C. or lower, that it has a (100) orientation of 50%, or more preferably, 70% or more, a hydrogen content of 2.5 atom %, or less, preferably 1 atom % or less, a fluorine content of 3 atom %, or less preferably 1 atom % or less, that a source electrode and a drain electrode are provided on said polycrystalline silicon thin film, and that a gate electrode is provided on the polycrystalline silicon thin film between the two electrodes through a gate insulating film.

Polycrystalline silicon thin film transistor of this invention is characterized in that polycrystalline silicon thin film is formed by a plasma CVD method or a photo CVD method at a low temperature using silicon hydride as the film forming gas, and silicon fluoride or silicon chloride gas as an etching gas, that said polycrystalline silicon thin film has a (220) orientation of 30% or less, a hydrogen content of 2.5 atom % or less, a fluoride content of 3 atom % or less, that a source electrode and a drain electrode are provided on said polycrystalline silicon thin film, and that a gate electrode is provided on the polycrystalline silicon thin film between the two other electrodes through an insulating film.

DESCRIPTION OF THE PREFERRED EMBODIMENTS

The following is a description of a polycrystalline silicon thin film of this invention.

To obtain a polycrystalline silicon thin film of this invention, a substrate, other than single crystalline silicon, such as glass, ceramic, metal, etc. is used, and a polycrystalline silicon thin film is formed by a plasma CVD method on this substrate. When single crystalline silicon is used as a substrate, epitaxial film is obtained if the condition of crystallization is selected such as plasma CVD, and a polycrystalline silicon thin film of this invention is not obtained.

As the film forming gases to form the polycrystalline silicon, there are $SiH_mX_{4-m}$ (m is 1–4, preferably 2–4; X is Cl or F atom, preferably F atom.), $Si_2H_6$ and $Si_3H_8$, etc. These film forming gases may be used alone, or two or more types of these gases may be mixed and used.

As the etching gas, there are $SiF_4$, $Si_2F_6$, $SiCl_4$, $F_2$, $Cl_2$, etc. These etching gases may be used alone or two or more types of these gases may be mixed and used.

Polycrystalline silicon thin film of this invention can be obtained by keeping a balance between the crystal growth and etching, by mixing the film forming gas and the etching gas as appropriate. Such balance can be easily adjusted by mixing and using the above film forming gas and etching gas as appropriate, while it is preferable that $SiF_4$ and $Si_2H_6$ are used alone or inadmixture. As etching gas, it is preferable to use $SiF_4$ and $F_2$ alone or in admixture.

Because the pressure in the chamber where the plasma is generated is related to the quantity of energy of the atoms which reach the substrate surface, it is necessary to set the pressure at 0.02–15 Torr, or more preferably at 0.1–5 Torr.

To the above film forming gas and etching gas, inert gas such as rare gas, preferably, helium, neon, argon, hydrogen, etc. may be added as a diluent gas. The diluent gas is preferably used in a proportion of 1–1000 times, or more preferably 5–100 times, as much as the etching gas.

For the ratio between the film forming gas and the etching gas, it is preferably to use the etching gas in a proportion of about 1–500 times as much as the film forming gas, or more preferably 5–200 times. If the etching gas proportion is less than the film forming gas, the substrate surface cannot be maintained in the best condition for the growth of polycrystalline silicon, while if it is more than 500 times as much as the film forming gas, the etching speed becomes too fast, so the crystal growth speed of silicon is decreased.

The reaction gases satisfying the above conditions are decomposed by glow discharge at a power density of 0.01–10 $W/cm^2$, or more preferably 0.1–5 $W/cm^2$, and a polycrystalline silicon thin film is formed on a substrate maintained at a constant temperature of about 100°–700° C., or more preferably, about 300°–600° C. The discharge mode may be RF, DC, MW (microwave).

If the substrate temperature is lower than 100° C., an amorphous phase appears, and it is converted to a micro-crystalline structure, thus deteriorating the product quality. If the substrate temperature is increased to higher than 700° C., the performance characteristics of the product are not improved, and the advantage of plasma CVD, as a low temperature method, cannot be utilized.

Power density differs according to the type and pressure of the reaction gas. If the power density is lower than 0.01 $W/cm^2$, the pressure of the reaction gas must be decreased, and the film forming speed decreases. If it exceeds 10 $W/cm^2$, it is not desirable because the quality of the thin film cannot be maintained at a high level.

As another embodiment of this invention, a polycrystalline silicon thin film can be formed by a plasma CVD method on a substrate of Corning 7059 glass, or borosilicate glass having a strain point of 600° C. or lower.

As the silicon-atom-supply-gas with film forming property to form a polycrystalline silicon film on such glass substrate. it is possible to use at least one type of gas selected from the group consisting of $SiF_4$, $Si_2F_6$ and $SiCl_4$. These gases have been regarded as etching gases in the past in the technique of manufacturing a silicon crystalline thin film. With a reaction gas containing small quantity of hydrogen gas, the role of the silicon-atom-supply-gas with a film forming property has been given to these gases.

It is possible to introduce a hydrogen-atom-supply-gas, other than hydrogen gas, into the above reaction gases or to introduce $F_2$ or $Cl_2$, more preferably $F_2$, as the etching gas.

The hydrogen-atom-supply-gas, other than hydrogen gas, is selected from $SiH_{4-n}X_n$ (n=0-3; X=F or Cl atom) and $Si_2H_8$ because these gases do not introduce useless impurities into the reaction system. Particularly, it is desirable to use silane fluoride, expressed as $SiH_{4-m}X_m$ (m=1-3), in order to reduce the danger of ignition.

In the fabrication of a polycrystalline silicon thin film by this embodiment, a balance must be kept between the crystal growth and etching. This can be easily adjusted by adequately mixing the silicon-atom-supply-gas with a film forming property and hydrogen gas, or a hydrogen-atom-supply-gas other than hydrogen gas, if necessary. Particularly, it is preferable to use $SiF_4$ and $Si_2F_6$ as the silicon atom supply gas with film forming property alone or in admixture.

An intrinsic polycrystalline silicon thin film can be formed on a normal glass substrate or another substrate, other than a single crystalline silicon substrate. Also, it is possible to turn the formed polycrystalline silicon thin film to p-type or n-type by mixing a dopant gas of group III or group V of the periodic table into the reaction gas. As the above dopant gas in this case, there are used a hydride of diborane, arsine, etc.

Figure 1A:
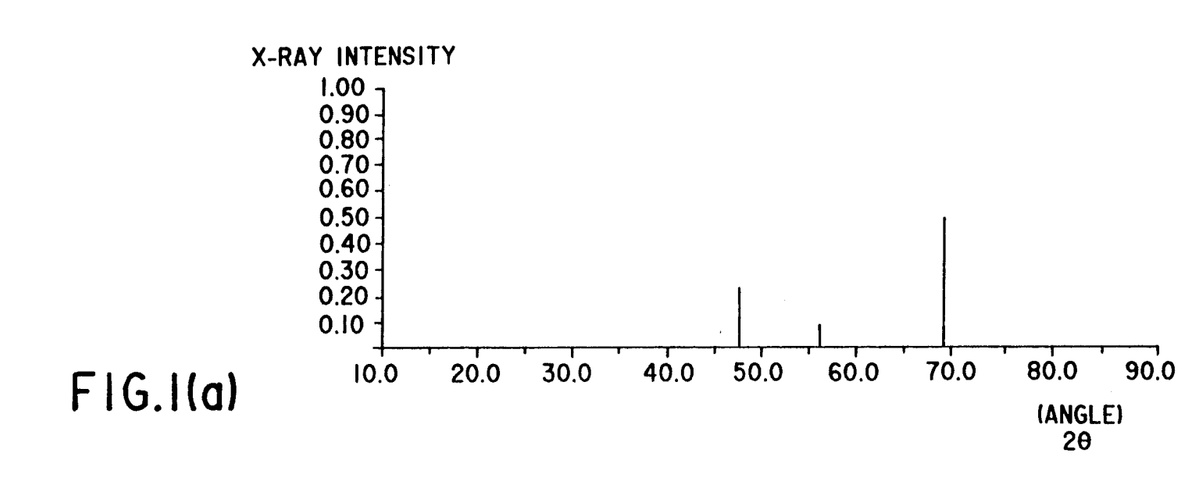
FIGS. 1(a) and 1(b) are diagrams of an x-ray diffraction to explain the orientation of the polycrystalline silicon according to the present invention.
Figure 1B:
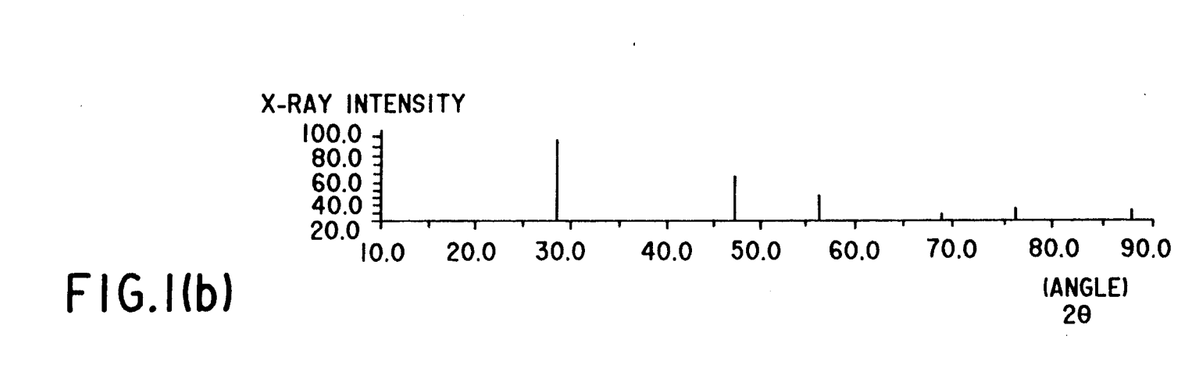

When a polycrystalline silicon thin film formed by the predetermined procedure was analyzed by X-ray diffraction. data, as shown in FIG. 1, were obtained.

FIG. 1 (a) shows the X-ray diffraction intensity of polycrystalline silicon of this invention, and FIG. 1 (b) shows the X-ray diffraction intensity based on an ASTM card standard specimen).

According to ASTM card, the ratio of the diffraction intensity in case of polycrystalline silicon with no preferential orientation is:

(111):(220):(311):(400) = 100:55:30:5 as shown in FIG. 1 (b). In contrast, the ratio of X-ray diffraction intensity of the thin polycrystalline silicon film as obtained by this invention is:

(111):(220):(311):(400) = 0:23:10:50

From the ratio of the standard value to the measured value, the orientation property is obtained as: (111):0%, (220):4%, (311):3%, and (400):93%. (400) is identical to (100), and this reveals that a thin polycrystalline silicon film of this invention has very strong (100) orientation. When manufactured under different conditions as shown in the embodiment to the described below, polycrystalline silicon having (100) orientation of 70% or more was obtained.

Because the (100) orientation is 70% or more, the thin film surface has excellent flatness, and a silicon crystal has also been grown as large as about 0.05-5 μm, and the surface area of the grain in unit volume is decreased. Thus, the quantity of hydrogen to terminate the dangling bonds present at the grain boundary is one atom % or less, and it is easily reduced to 0.2 atom %. Fluorine also has the function of dangling bond termination. this can contribute to improvement of electrical property when its quantity contained in a thin film is set to 1 atom % or less.

When a glass substrate is used, it is possible to prevent alkaline impurities such as Na, Ca, K, etc., in the glass substrate, from diffusing toward the polycrystalline silicon because of the low processing temperature.

Also, the polycrystalline silicon thin film of this invention can be fabricated by a photo CVD method.

In this case, a low pressure mercury lamp, having a resonance line at 185 nm and 254 nm, is used as the light source, and $SiH_4$ and $SiF_4$ are used as the film forming gas and etching gas, respectively. The substrate (Corning 7059 glass) temperature is set to 400° C., and the pressure to about 1.5 Torr. Into a reaction chamber, under vacuum conditions of $5 \times 10^{-6}$ Torr, 10 SCCM of $SiH_4$, 50 SCCM of $SiF_4$, 50 SCCM of $H_2$ and 50 SCCM of Ar as carrier gas for the intensifier (Hg) (mercury temperature: 80° C.), are introduced and a low pressure mercury lamp is turned on when the pressure has stabilized. The polycrystalline silicon thin film thus obtained has: a growth speed of 0.3 Å/sec., a grain size of 1500 Å, and a (100) orientation of 70% or more, as in the case of the plasma CVD method. When a glass substrate was used, there was almost no diffusion of impurities from the substrate into the polycrystalline silicon.

Thus, the polycrystalline silicon thin film of this invention can be fabricated by a plasma CVD method and a photo CVD method, and a film forming gas and an etching gas are used as raw material gases. However, the present invention can be achieved by using a raw material gas, having both film forming property and etching property, and hydrogen. As the raw material gas in this cae, $SiF_4$ and $Si_2F_6$ are selected, and hydrogen gas is used in a proportion of about 1000/1-1/1000, or more preferably, 400/1-1/200.

Next, description is given of another embodiment of this invention which contains high concentration of dopant in the interface region between the polycrystalline silicon and the substrate.

In this embodiment, there is no special restriction to the substrate. In general, transparent glass is used, and a glass with low strain point (about 600° C. or lower) is particularly useful.

As the dopant, an n-type or p-type dopant, which is already known i.e. $PH_3$, $PF_3$, $B_2H_6$, $AsCl$, $SbCl_3$, etc., may be used. The hydride or the fluoride is best suited for the purpose.

It is desirable that the dopant is contained at a high concentration near the substrate. "Near the substrate" means about 100-200 Å from the substrate surface, and "high concentration" means $10^{18}$-$10^{19}$/cm$^3$ or more. In the present embodiment, the dopant should be provided at least at 100 Å from the substrate surface, preferably at 200 Å, with a high concentration of $10^{18}$/cm$^3$ or more, or more preferably $5 \times 10^{18}$/cm$^3$ or more.

With the dopant provided at high concentration near the substrate, the crystal grain size of the silicon thin film grows extensively—at least to 0.2-0.3 μm, or to 0.5 μm or more, and further to 0.8-1 μm or more. Polycrystalline silicon of such large grain size can be formed at 2000 Å from the substrate surface.

There is no special restriction to the thickness of the entire polycrystalline silicon thin film, while it is generally 3000 Å or less in a thin film transistor.

Dopant can be contained in a site other than near the substrate. It is desirable to reduce its content more as the distance from substrate surface becomes longer. Polycrystalline silicon thin films can be converted into transistors or other devices through doping and other processes.

To form a polycrystalline silicon thin film, a solid phase growth method is used, in which amorphous silicon containing a dopant at high concentration near the substrate surface is heated. In addition to this, a thermal CVD method, or a plasma CVD method, etc. may be used. Thus, a polycrystalline silicon thin film can be formed in a large area, e.g. in an area of 300×400 mm or more.

Figure 2:
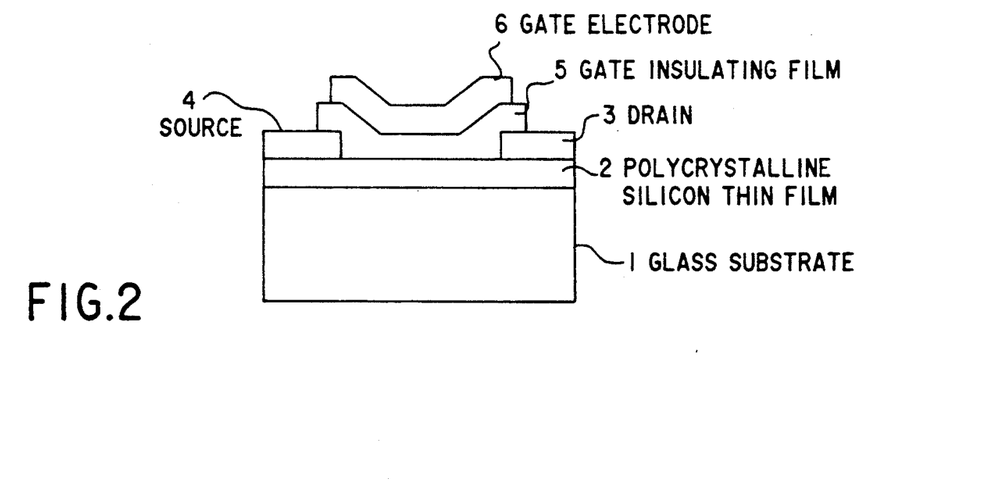
FIG. 2 is a schematic drawing to explain a polycrystalline silicon transistor of this invention.

Next, description is given of a top-gate coplanar type polycrystalline silicon thin film transistor of this invention in connection with FIG. 2.

On a substrate 1 of Corning 7059 glass, an intrinsic polycrystalline silicon thin film 2 is formed on the entire surface by a plasma CVD or a photo CVD method as described above, and an insulating film 5, such as $SiO_2$, $SiN_x$, etc., is formed on it. Next, a photo resist is coated for masking, and a resist pattern is formed by exposure and developing. By plasma discharge of etching gas, such as $CF_4$, $CHF_3$, etc., dry etching is performed, and the insulating film on the region without resist is removed. An N-type thin film is formed on the entire surface by mixing dopant gas in the reaction gas as described above, and N-type regions (source and drain regions) are thus formed. After the N-type thin film is formed, the predetermined resist parameters are formed, and a source electrode 4 and a drain electrode 3 are formed by sputtering. Selective formation is performed by lift-off, and the N-type thin film on the insulating film 5 is removed by etching. After the insulating film is deposited, a gate electrode 6 is formed, and a thin film transistor is thus obtained.

A thin film driving circuit, such as a liquid crystal display, can be obtained by forming an address decoder, a memory switch, an inverter, etc., using the thin film transistor of this invention.

Under different conditions, as described in the example below, a polycrystalline silicon of this invention having a (100) orientation of 50% or more was obtained. When the (100) orientation is 50% or more, thin film surface has excellent flatness, and the silicon crystal grain also grows to as large as about 0.05–5 μm. Because the crystal surface area in the thin film is decreased, the quantity of hydrogen required for terminating the dangling bonds present at the grain boundaries is 2.5 atom % or less, and it can be easily reduced to 0.2–1 atom %. Fluorine can also function to terminate dangling bonds, and its quantity contained in the thin film is 3 atom % or less, and it can be easily reduced to 0.2–1 atom % or less. This can contribute to the improvement of electrical property. It is preferable that the (100) orientation is 70% or more.

The (220) orientation can be extensively reduced and the (100) orientation can be greatly reinforced by plasma CVD, particularly by using $SiH_4$ and $Si_2H_6$ alone or in admixture as the film forming gas, on a transparent substrate 1, using $SiF_4$ and $F_2$ as the etching gas alone or in admixture, and using hydrogen gas as dilute gas. As described in the subsequent embodiments, a thin film having a (220) orientation by 30% or less could be obtained by changing the manufacturing conditions. When the (220) orientation is 30% or less, the (100) orientation increases. This provides excellent flatness to the thin film surface, and the silicon crystal gain also grows to as large as about 0.05–5 μm. Because the crystal surface area in the thin film is decreased, the quantity of hydrogen needed to terminate the dangling bonds present in the grain boundary is 2.5 atom % or less, and it can be easily reduced to 0.2–1 atom % or less. Fluorine also has the function of dangling bond termination. By reducing its quantity contained in the thin film to 1–3 atom % or less, it can contribute to the improvement of electrical property. It is particularly preferable that the (220) orientation is 20% or less.

EXAMPLE 1

In a reaction chamber under high vacuum condition of $1 \times 10^{-9}$ Torr, a mixed gas of $SiH_4:SiF_4:H_2 = 1:50:50$, was introduced as a reaction gas in a quantity of 30 SCCM, and the pressure of the reaction gas was adjusted to 2.0 Torr. Then, this reaction gas was decomposed by glow discharge with a power density of 0.7 W/cm$^2$, using a radio frequency power of 13.56 MHz, and a silicon thin film was formed, on a glass substrate heated at 400° C., up to a thickness of 2 μm.

When Raman spectroscopy was performed on the thin film thus obtained, a very sharp spectrum, based on crystal silicon, was observed with a half-width of 5 cm$^{-1}$ at the position of 520 cm$^{-1}$.

When the X-ray intensity was measured by X-ray diffraction to obtain the percentage of (100) orientation, it was 97%. The average grain size was 5500 Å when measured by transmission electron microscope. Further, the electron mobility of this thin film was obtained by the Hall effect, and it was 30 cm$^{-2}$ V$^{-1}$·S$^{-1}$.

The hydrogen content was 0.1%, and the fluorine content was 0.3%.

EXAMPLES 2–6

A polycrystalline silicon thin film was obtained under the conditions of Table 1 by the same procedure as in example 1, and the average crystal grain size, hydrogen content and electron mobility were measured. The results were as shown in Table 2.

TABLE 1

| Example | Type of reaction gas | Ratio | Temperature °C. | Pressure (Torr) | Discharge power (W/cm$^2$) |
| --- | --- | --- | --- | --- | --- |
| 2 | $SiH_4:SiF_4:H_2$ | 1:50:70 | 300 | 1.0 | 1.0 |
| 3 | $SiH_4:SiF_4$ | 1:50 | 500 | 2.0 | 1.7 |
| 4 | $Si_2H_6:SiF_4:H_2$ | 1:150:100 | 400 | 1.0 | 1.0 |
| 5 | $SiH_2F_2:SiF_4:H_2$ | 1:100:50 | 600 | 1.0 | 1.0 |
| 6 | $SiH_2CL_2:SiF_4:H_2$ | 1:100:100 | 500 | 0.5 | 1.0 |
| Comparative example | | | | | |
| 2 | $SiH_4:H_2:SiF_4$ | 1:10:10 | 400 | 1.0 | 1.0 |

TABLE 1-continued

| Example | Type of reaction gas | Ratio | Temperature °C | Pressure (Torr) | Discharge power (W/cm²) |
|---|---|---|---|---|---|
| 5 | SiH₄:H₂:SiF₄ | 1:50:10 | 400 | 1.0 | 1.0 |

TABLE 2

| Example | Electron mobility (cm²·V⁻¹·S⁻¹) | Orientation (%) | Silicon film | Grain size (Å) | Hydrogen (fluorine) content (atom %) |
|---|---|---|---|---|---|
| 2 | 10 | 75 | Poly-crystal | 1500 | 0.2 (0.5) |
| 3 | 28 | 93 | Poly-crystal | 4500 | 0.1 (0.3) |
| 4 | 23 | 82 | Poly-crystal | 4000 | 0.2 (0.5) |
| 5 | 28 | 75 | Poly-crystal | 3000 | 0.1 (0.2) |
| 6 | 10 | 70 | Poly-crystal | 1000 | 0.2 (0.5) |
| Comparative example | | | | | |
| 2 | 0.3 | 0 | Micro-crystal | 150 | 10 (10) |
| 3 | 5 | 30 | Poly-crystal | 300 | 3 (3) |

Comparative Example

A specimen was prepared by the same procedure as in the embodiment 1, except that the substrate temperature was 300° C., that the pressure in the plasma reaction chamber was 5 Torr, that a mixed gas, containing SiH₄:H₂=1:100, was used as raw material gas, and that plasma CVD was performed with a power density of 2 W/cm². In the amorphous silicon of the silicon thin film thus obtained, many microcrystals were present like islands. Hydrogen concentration of this silicon layher was as high as about 8 atom %. Electron mobility was as low as about 8 atom %. Electron mobility was as low as 0.5 cm²·V⁻¹·S⁻¹, and there was no (100) orientation.

Comparative Examples 2 and 3

A silicon thin film was formed on a glass substrate by the same procedure as in the comparative example 1 under the conditions of Table 1. The silicon thin film thus obtained was as shown in Table 2, and it was confirmed that this was inferior to the polycrystalline silicon thin film of this invention.

EXAMPLE 7

In a reaction chamber, under high vacuum condition $1 \times 10^{-9}$ Torr, a mixed gas of H₂:SiF₄=10:30 (volume ratio; in this case, the F is 60 times as much as the H.) was supplied as reaction gas by SCCM, and the pressure of the reaction gas was adjusted to 0.5 Torr. Next, this reaction gas was turned to plasma by using a power flux density of 0.7 W/cm² using radio frequency power of 13.56 MHz, and a silicon thin film was formed, on a substrate of Corning 7059 glass heated at 400° C., up to a thickness of 1.9 μm.

When Raman spectroscopy was performed on the thin film thus obtained, a very sharp spectrum, bsed on crystal silicon, was observed with a half-width of 5 cm⁻¹ at 520 cm⁻¹.

When the X-ray intensity was measured by X-ray diffraction, the percentage of (100) orientation was 97%. The average grain size was 5000 Å. Further, when measured by Hall effect, the electron mobility of this thin film was 30 cm²·V⁻¹·S⁻¹.

Hydrogen content was 0.1%, and fluorine content was 0.2%.

EXAMPLES 8-13

A polycrystalline silicon thin film was obtained by the same procedure as in example 7 under the conditions of Table 3. When the average crystal grain size, hydrogen content and electron mobility were measured, the results were as summarized in Table 4.

TABLE 3

| Example | Type of reaction gas | Ratio | Substrate | Temperature °C | Pressure (Torr) | Discharge power (W/cm²) |
|---|---|---|---|---|---|---|
| 8 | H₂:SiF₄ | 10:30 | Corning 7059 glass | 300 | 0.5 | 0.5 |
| 9 | H₂:SiF₄ | 1:50 | | 500 | 1.5 | 0.8 |
| 10 | H₂:SiH₄:SiF₄ | 14:1:100 | | 350 | 1.0 | 1.0 |
| 11 | H₂:SiF₄ | 50:25 | | 450 | 1.0 | 1.0 |
| 12 | H₂:SiF₄:F₂ | 1:30:10 | | 400 | 1.5 | 0.5 |
| 13 | H₂:SiH₄:F₂:SiF₄ | 1:1:1:50 | | 350 | 1.2 | 1.3 |

TABLE 4

| Example | Electron mobility (cm²·V⁻¹·S⁻¹) | Orientation (%) | Silicon film | Grain size (μm) | Hydrogen (fluorine) content (atom %) |
|---|---|---|---|---|---|
| 8 | 23 | 88 | Poly-crystal | 0.38 | 0.2 (0.5) |
| 9 | 28 | 94 | Poly-crystal | 0.47 | 0.1 (0.3) |
| 10 | 25 | 86 | Poly-crystal | 0.41 | 0.2 (0.5) |
| 11 | 19 | 83 | Poly-crystal | 0.24 | 0.1 (0.3) |
| 12 | 21 | 85 | Poly-crystal | 0.27 | 0.1 (0.3) |
| 13 | 10 | 72 | Poly-crystal | 0.12 | 0.2 (0.5) |

Comparative Example 4

The specimen was prepared by the same procedure as in embodiment 1, except that the glass substrate temperature was 300° C., that the pressure in the plasma reaction chamber was 5 Torr, that a mixed gas of SiH₄:H₂=1:100 was used as the raw material gas, and that plasma CVD was performed with a power density of 2 W/cm². In the amorphous silicon phase of the silicon thin film thus obtained, many microcrystals were present like islands. The hydrogen concentration of this silicon layer was as high as about 8 atom %, and the electron mobility was as low as 0.3 cm²·V⁻¹·S⁻¹.

Comparative Examples 5 and 6

A silicon thin film was formed on a glass substrate by the same procedure as in comparative example 4 under the conditions of Table 5. The silicon thin film thus obtained was as shown in Table 6, and it was confirmed that it was inferior to the polycrystalline silicon thin film of this invention.

Comparative Examples 7-9

A silicon thin film was formed on a glass substrate by the same procedure as in example 7 under the conditions of Table 7. The results are as shown in Table 8. It was demonstrated from these results that satisfactory results were not obtained when the quantity of hydrogen in the reaction gas was too low or when the number of hydrogen atoms were to many compared with that of halogen atoms.

TABLE 5

| Comparative example | Reaction gas | Ratio | Substrate | Temperature °C. | Pressure (Torr) | Discharge power (W/cm$^2$) |
|---|---|---|---|---|---|---|
| 5 | H$_2$:SiH$_4$:SiF$_4$ | 1:0.1:1 | Corning 7059 glass | 400 | 1.0 | 1.0 |
| 6 | H$_2$:SiH$_4$:SiF$_4$ | 1:0.02:0.2 | | 400 | 1.0 | 1.0 |

TABLE 6

| Comparative example | Electron mobility (cm$^2$/V · S) | Orien- Orientation (%) | Silicon film | Average grain size (μm) | Hydrogen (fluorine) content (atom %) |
|---|---|---|---|---|---|
| 5 | 1.1 | 10% | Micro-crystal | 0.015 | 10 (10) |
| 6 | 5 | 15% | Poly-crystal | 0.03 | 3 (3) |

TABLE 7

| Comparative example | Reaction gas | Ratio | Substrate | Temperature °C. | Pressure (Torr) | Discharge power (W/cm$^2$) |
|---|---|---|---|---|---|---|
| 7 | H$_2$:SiF$_4$ | 1:0.8 | Corning 7059 glass | 300 | 1.2 | 0.7 |
| 8 | H$_2$:SiF$_4$ | 1:0.25 | | 300 | 1.0 | 0.7 |
| 9 | H$_2$:SiF$_4$ | 1:600 | | 300 | 1.2 | 0.7 |

TABLE 8

| Comparative example | Electron mobility (cm$^2$/V · S) | Silicon film structure | Average grain size (μm) | Hydrogen (fluorine) content (atom %) |
|---|---|---|---|---|
| 7 | 0.4 | Micro-crystal | 0.007 | 7 (6) |
| 8 | — | Amorphous | — | 15 (4) |
| 9 | — | Film not producible | — | — |

EXAMPLE 14

Figure 3A:
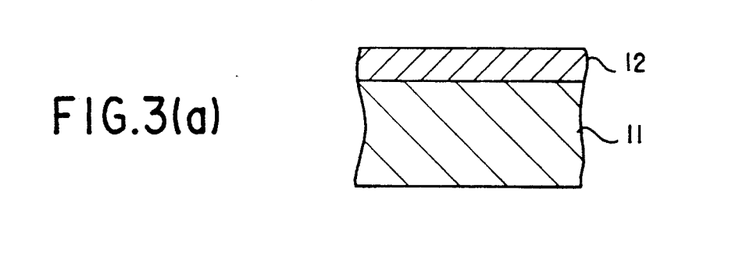
FIGS. 3(a), 3(b), and 3(c) show other embodiments of a polycrystalline silicon thin film of this invention.
Figure 3B:
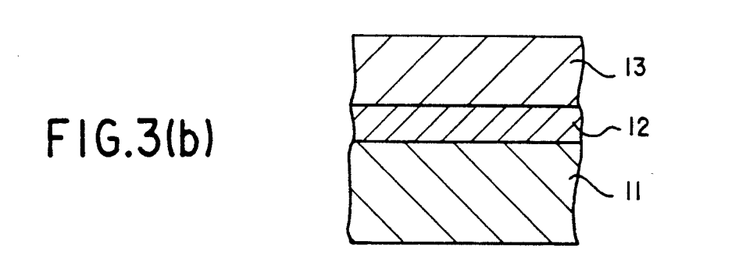
Figure 3C:
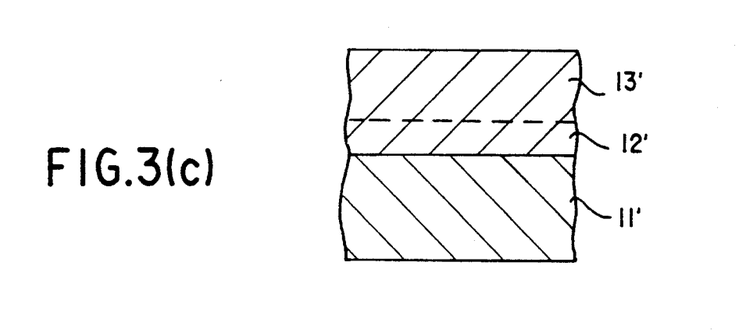

Description is given here is connection with FIG. 3.

An amorphous silicon film 12, containing phosphorus in a concentration of $5 \times 10^{18}$/cm$^2$, was formed to a thickness of 100 Å by plasma CVD method on a glass substrate 11 (HOYA NA-40) with a low strain point (about 700° C.) (substrate size: 100×100 mm) (FIG. 3 (a)). Using silane as the raw material gas and PH$_3$ as the doping gas, a film was formed under the condition of: PH$_3$/SiH$_4$=20 ppm, flow rate 50 SCCM, substrate temperature 350° C., pressure 200 mTorr, and RF power (13.56 MHz) 0.025 W/cm$^2$.

Then, an amorphous silicon thin film 13, containing phosphorus in a concentration of $1 \times 10^{17}$/cm$^3$, was formed on this n-type amorphous silicon thin film 2 up to a thickness of 2000 Å. The conditions for forming the film were the same as in the case of the n-type thin film 12 except that the PH$_3$ concentration was different.

The amorphous silicon thin film thus obtained was annealed at 600° C. for 60 hours under nitrogen atmosphere.

As a result, amorphous silicon 13 was changed to polycrystalline silicon 13'. Average grain size was 0.6 μm, and Hall effect mobility was 50 cm$^2$/V sec.

An n-type thin film 13 was formed at a thickness of 3000 Å by the same procedure as above, except that an n-type thin film 12 was not formed. In the silicon thin film obtained by annealing, the average grain size was 0.4 μm, and the Hall effect mobility was 36 cm$^2$/V sec.

EXAMPLE 15

In a reaction chamber under high vacuum condition of $1 \times 10^{-9}$ Torr, a mixed gas of SiH$_4$:SiF$_4$:H$_2$=1:50:30 was supplied as the reaction gs in a quantity of 30 SCCM, and the pressure of the reaction gas was adjusted to 2.0 Torr. Then, this reaction gas was decomposed by glow discharge with a power density of 0.7 W/cm$^2$, using a radio frequency power of 13.56 MHz, and a silicon thin film was formed, on a Corning 7059 glass substrate heated at 400° C., up to a thickness of 1 μm.

When Raman spectroscopy was performed on thin film thus obtained, a very sharp spectrum based on crystal silicon was observed with half-width of 5 cm$^{-1}$ at 520 cm$^{-1}$.

When X-ray intensity was measured by X-ray diffraction, the percentage of (100) orientation was 97%. By transmission electron microscope, the average grain size was measured as 4500 Å. Further, the electron mobility was measured by the Hall effect as 40 cm$^{-2}$ V$^{-1}$ S$^{-1}$. Hydrogen content was 0.1%, and fluorine content was 0.2%.

Using this polycrystalline silicon thin film, a top-gate coplanar type TFT was fabricated by the above procedure, and its field effect mobility was measured as 37 cm$^2$/V sec., and it was confirmed that sufficient property was provided.

EXAMPLES 16-20

A polycrystalline silicon thin film was obtained by the same procedure as the example 15 under the conditions of Table 9, and the average crystal grain size, hydrogen content and electron mobility were measured. The results are summarized in Table 10.

Comparative Example 10

The specimen was prepared by the same procedure as in embodiment 1, except that the substrate temperature was 300° C., that the pressure in the plasma reaction chamber was 5 Torr, that a mixed gas of $SiH_4:H_2=1:100$ was used as the raw material gas, and that plasma CVD was performed with a power density of 2 W/cm². In the amorphous silicon phase of the silicon thin film thus obtained, many microcrystals were present like islands. Hydrogen concentration of this silicon layer was as high as 8 atom %, and electron mobility was as low as 0.3 cm² $V^{-1}S^{-1}$. There was no (100) orientation, and this thin film was not suitable for TFT.

Comparative Examples 11 and 12

A silicon thin film was formed on a glass substrate by the same procedure as in comparative example 10 under the conditions of Table 9. The silicon thin film thus obtained was as shown in Table 10. It was confirmed that this was inferior to the polycrystalline silicon thin film of this invention and was not suitable for TFT.

EXAMPLES 21-25

A polycrystalline silicon thin film was obtained by the same procedure as in the example 15 under the conditions of Table 11, and the average crystal grain size, hydrogen content and electron mobility were measured. The results were as shown in Table 12.

Comparative Examples 13 and 14

A silicon thin film was formed on a glass substrate by the same procedure as in comparative example 10 under the conditions of Table 11. The silicon thin film thus obtained was as shown in Table 12. It was confirmed that it was inferior to the polycrystalline silicon thin film of this invention and was not suitable for TFT.

TABLE 9

| Example | Type of reaction gas | Ratio | Temperature °C. | Pressure (Torr) | Discharge power (W/cm²) |
|---|---|---|---|---|---|
| 16 | $SiH_4:SiF_4:H_2$ | 1:50:30 | 300 | 0.5 | 1.1 |
| 17 | $SiH_4:SiF_4:H_2$ | 1:50:20 | 500 | 0.5 | 1.7 |
| 18 | $H_2:SiF_4$ | 20:50 | 400 | 1.0 | 1.0 |
| 19 | $SiH_2F_2:SiF_4$ | 1:100 | 550 | 1.0 | 1.0 |
| 20 | $SiH_2CL_2:SiF_4$ | 1:100 | 500 | 1.5 | 1.0 |
| Comparative example | | | | | |
| 11 | $SiH_4:H_2:SiF_4$ | 1:10:10 | 400 | 1.0 | 1.0 |
| 12 | $SiH_4:H_2:SiF_4$ | 1:50:10 | 400 | 1.0 | 1.0 |

TABLE 10

| Example | Electron mobility (cm²/V · S) | Orientation (%) | Silicon film | Grain size Å | Hydrogen (fluorine) content (atom %) | Field effect mobility (cm².V · S) |
|---|---|---|---|---|---|---|
| 16 | 10 | 75 | Poly-crystal | 1500 | 0.2 (0.5) | 8 |
| 17 | 28 | 93 | Poly-crystal | 4500 | 0.1 (0.3) | 23 |
| 18 | 23 | 82 | Poly-crystal | 4000 | 0.2 (0.5) | 25 |
| 19 | 28 | 75 | Poly-crystal | 3000 | 0.1 (0.2) | 28 |
| 20 | 10 | 70 | Poly-crystal | 1000 | 0.2 (0.5) | 7 |
| Comparative example | | | | | | |
| 11 | 0.3 | 0 | Micro-crystal | 150 | 10 (10) | 0.4 |
| 12 | 5 | 30 | Poly-crystal | 300 | 3 (3) | 3 |

TABLE 11

| Example | Type of reaction gas | Ratio | Temperature °C. | Pressure (Torr) | Discharge power (W/cm²) |
|---|---|---|---|---|---|
| 21 | $SiH_4:SiF_4:H_2$ | 1:50:30 | 300 | 0.5 | 1.1 |
| 22 | $SiH_4:SiF_4:H_2$ | 1:50:20 | 500 | 0.5 | 1.7 |
| 23 | $H_2:SiF_4$ | 20:50 | 400 | 1.0 | 1.0 |
| 24 | $SiH_2F_2:SiF_4$ | 1:100 | 550 | 1.0 | 1.0 |
| 25 | $SiH_2CL_2:SiF_4$ | 1:100 | 500 | 1.5 | 0.8 |
| Comparative example | | | | | |
| 13 | $SiH_4:H_2:SiF_4$ | 1:10:10 | 400 | 1.0 | 1.0 |
| 14 | $SiH_4:H_2:SiF_4$ | 1:50:10 | 400 | 1.0 | 1.0 |

TABLE 12

| Example | Electron mobility (cm²/V·S) | Orientation (%) | Silicon film | Grain size Å | Hydrogen (fluorine) content (atom %) | Field effect mobility (cm²/V·S) |
|---|---|---|---|---|---|---|
| 21 | 12 | 70 | Poly-crystal | 1500 | 0.2 (0.5) | 10 |
| 22 | 28 | 93 | Poly-crystal | 4500 | 0.1 (0.3) | 23 |
| 23 | 23 | 82 | Poly-crystal | 4000 | 0.2 (0.5) | 25 |
| 24 | 28 | 75 | Poly-crystal | 3000 | 0.1 (0.3) | 28 |
| 25 | 6 | 50 | Poly-crystal | 1000 | 0.2 (0.5) | 5 |
| Comparative example | | | | | | |
| 13 | 0.3 | 0 | Micro-crystal | 150 | 10 (10) | 0.4 |
| 14 | 5 | 30 | Poly-crystal | 300 | 3 (3) | 3 |

EXAMPLE 26

A silicon thin film was formed on a glass substrate by the same procedure as in the example 15 up to a thickness of 1 μm.

When Raman spectroscopy was performed on the thin film thus obtained, a very sharp spectrum, based on crystal silicon, was observed with a half-width of 5 cm$^{-1}$ at 520 cm$^{-1}$.

When the X-ray intensity was measured by X-ray diffraction to obtain the percentage of orientation, (220) was 2% or less, and (100) was 97%. By transmission electron microscopy, the average grain size was measured as 4500 Å. Further, the electron mobility of this thin film was measured by the Hall effect as 40 cm$^{-2}$ V$^{-1}$ S$^{-1}$. The hydrogen content was 0.1%, and the fluorine content was 0.2%.

Using this polycrystalline silicon thin film, a top-gate coplanar TFT was fabricated by the above procedure, and its field effect mobility was obtained. It was 38 cm²/V sec., and it was confirmed that the product had sufficient property.

Thus, a transistor with satisfactory characteristics was obtained even when a glass substrate with low strain point was used. Naturally, better characteristics can be obtained if a glass with a higher strain point is used.

EXAMPLES 27–31

A polycrystalline silicon thin film was obtained by the same procedure as in the example 15 under the conditions of Table 11, and the average crystal grain size, hydrogen content and electron mobility were measured. The results are summarized in Table 13.

TABLE 13

| Example | Electron mobility (cm²/V·S) | Orientation (220) (%) | Silicon film | Grain size Å | Hydrogen (fluorine) content (atom %) | Field effect mobility (cm²/V·S) |
|---|---|---|---|---|---|---|
| 27 | 12 | 19 | Poly-crystal | 1500 | 0.2 (0.5) | 10 |
| 28 | 28 | 5 | Poly-crystal | 4500 | 0.1 (0.3) | 23 |
| 29 | 23 | 13 | Poly-crystal | 4000 | 0.2 (0.5) | 25 |
| 30 | 28 | 17 | Poly-crystal | 3000 | 0.1 (0.2) | 28 |
| 31 | 6 | 27 | Poly-crystal | 1000 | 0.2 (0.5) | 5 |
| Comparative example | | | | | | |
| 16 | 0.3 | 82 | Micro-crystal | 150 | 10 (10) | 0.4 |
| 17 | 5 | 67 | Poly-crystal | 300 | 3 (3) | 3 |

Comparative Example 15

The specimen was prepared by the same procedure as in the embodiment 1, except that the substrate temperature was 300° C., that the pressure in the plasma reaction chamber was 5 Torr, that a mixed gas of SiH$_4$:H$_2$=1:100 was used as the raw material gas, and that plasma CVD was performed with a power density of 2 W/cm². In the amorphous silicon phase of silicon thin film thus obtained, many microcrystals were present like islands. The hydrogen concentration of this silicon layer was as high as about 8 atom %, and the electron mobility was as low as 0.3 cm² V$^{-1}$ S$^{-1}$. In orientation, (220) was 55%, and (100) was 8%. This thin film was not suitable for TFT.

Comparative Examples 16 and 17

A silicon thin film was formed on a glass substrate by the same procedure as in comparative example 15 under the conditions of Table 11. The silicon thin film thus obtained was as shown in Table 13. It was confirmed that it was inferior to a polycrystalline silicon thin film of this invention and was not suitable for TFT.

What we claim is:

1. A polycrystalline silicon thin film disposed on a glass substrate having a strain point of 600° C. or lower, and having been deposited on said substrate by plasma CVD or photo CVD, wherein the (100) preferential orientation, determined by X-ray diffraction measurement, of said polycrystalline silicon is 50% or more.

2. A polycrystalline silicon thin film according to claim 1 having a hydrogen content of 1 atom % of less, a fluorine content of 1 atom % or less, and an average crystal grain size of 0.05–5 μm.

3. A polycrystalline silicon thin film according to claim 1 having a hydrogen content of 2.5 atom % of less, and a fluorine content of 3 atom % or less.

4. A polycrystalline silicon thin film transistor, including a source electrode and a drain electrode disposed on the polycrystal silicon thin film according to claim 3 wherein a gate electrode is disposed on said polycrystalline silicon thin film between said source and drain electrodes through an insulating film.

5. A polycrystalline silicon thin film transistor according to claim 4, having a (220) orientation in said film of less than 30%.

* * * * *